United States Patent
Rau et al.

(10) Patent No.: US 7,456,654 B1
(45) Date of Patent: Nov. 25, 2008

(54) METHOD AND APPARATUS FOR A PROGRAMMABLE LEVEL TRANSLATOR

(75) Inventors: Prasad Rau, Saint Louis, MO (US); Venu M. Kondapalli, Sunnyvale, CA (US); Jason R. Bergendahl, Sunnyvale, CA (US); Qi Zhang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 5 days.

(21) Appl. No.: 11/639,995

(22) Filed: Dec. 14, 2006

(51) Int. Cl.
*H03K 19/0175* (2006.01)
(52) U.S. Cl. .................................. 326/81; 326/68
(58) Field of Classification Search .................. 326/63, 326/68, 80–83, 86, 87, 33
See application file for complete search history.

(56) References Cited

U.S. PATENT DOCUMENTS

| | | | | |
|---|---|---|---|---|
| 6,933,765 B2 * | 8/2005 | Kanno et al. | ................. | 327/333 |
| 7,026,855 B2 * | 4/2006 | Sueoka et al. | ................ | 327/333 |
| 7,205,820 B1 * | 4/2007 | Yeung et al. | ................. | 327/333 |

* cited by examiner

*Primary Examiner*—James H Cho
(74) *Attorney, Agent, or Firm*—Michael T. Wallace; Michael R. Hardaway

(57) ABSTRACT

A level translator includes a programmable booster stage that augments the drive level of the level translator under certain conditions. The booster stage is programmably activated, e.g., via a memory cell or control bit, and augments operation of the pull-up stages of a cross-coupled latch within the level translator. When the voltage levels at the high voltage portion of the level translator are reduced below a threshold voltage, the booster stage is activated to maintain proper operation of the level translator despite the reduced voltage levels.

17 Claims, 6 Drawing Sheets

METHOD AND APPARATUS FOR A PROGRAMMABLE LEVEL TRANSLATOR

FIELD OF THE INVENTION

The present invention generally relates to level translators, and more particularly to programmable level translators.

BACKGROUND

Recent advances in the field of semiconductor integrated circuits have brought about higher levels of integration. Semiconductor manufacturing process advancements are driving the corresponding geometric dimensions for semiconductor devices to decreasingly smaller values. As semiconductor device dimensions shrink, the number of devices per unit area of semiconductor die grows. Given higher device densities within a given semiconductor die, a greater opportunity exists that devices, which must interface to one another, operate at incompatible drive levels.

One example of a semiconductor device that is required to operate at various drive levels may be illustrated by an integrated circuit (IC), such as a Field Programmable Gate Array (FPGA). In particular, the FPGA employs a logic core that operates at a fixed voltage supply. As semiconductor manufacturing processes advance, geometries of the semiconductor devices within the logic core decrease, which causes a decrease in threshold voltages of the semiconductor devices. Accordingly, the logic core must operate at decreasing voltage supply magnitudes. For example, as the geometry of the logic core shrinks from 130 nanometer (nm) geometries down to 45 nm geometries, the core voltage supply and logic core device threshold voltage similarly scales to decreasingly lower magnitudes to ensure proper operation.

While logic core voltages decrease, however, the FPGA is nevertheless required to maintain support of a wide range of input/output (I/O) interfaces, which further requires support of a wide power supply range at the I/O interface. Thus, as signals are exchanged between the logic core of the FPGA and the I/O interface portion of the FPGA, level translation is required, so that signals operating at logic core voltage magnitudes may be properly exchanged with the I/O interface, where signals operate at the higher I/O voltage magnitudes.

Level translation between the logic core and the I/O interface portion of the FPGA may be implemented by a cross-coupled latch architecture with feedback. In particular, differential input stages are cross-coupled, such that the logic output of a first stage activates the pull-up portion of the second stage, while the logic output of the second stage deactivates the pull-up portion of the first stage during a first phase of operation. Similar operation of the differential input stage occurs during a second phase of operation.

As a result of decreasing logic core voltages due to decreasing logic core device geometries, the cross-coupled latch fails to resolve itself, or resolves itself slowly, due to inadequate drive level of the cross-coupled feedback signal that originates from a logic core device. Thus, the failure of the cross-coupled latch seems to be linked to the decreasing logic core voltage magnitudes and also seems to be exacerbated by the lower magnitude I/O interface voltage levels.

An improvement to the conventional cross-coupled latch architecture is, therefore, required. In particular, a solution is needed that allows the cross-coupled latch to properly resolve itself across all combinations of I/O interface voltage magnitudes and logic core voltage magnitudes.

SUMMARY

To overcome limitations in the prior art, and to overcome other limitations that will become apparent upon reading and understanding the present specification, the present invention discloses an apparatus and method for a programmable level translator. The programmable level translators of the present invention function over a wide range of power supplies, enabling the support of a wide range of input/output (I/O) interfaces using the same I/O structure.

In accordance with one embodiment of the invention, a level translator comprises a first stage that is coupled to receive a first phase of an input signal operating between first and second voltage levels. The first stage is adapted to provide a first output signal operating between a third voltage level and the second voltage level, with the first output signal being provided at a first node. The level translator further comprises a second stage that is coupled to receive a second phase of the input signal operating between first and second voltage levels. The second stage is adapted to provide a second output signal operating between the third voltage level and the second voltage level, with the second output signal being provided at a second node. The level translator further comprises a booster stage that is coupled to the first and second nodes. The booster stage is activated by a control signal to increase a magnitude of the third voltage level of the first and second output signals. The control signal activates the booster stage when a power supply signal magnitude providing the third voltage level is below a threshold value.

In accordance with another embodiment of the invention, an integrated circuit (IC) comprises a first logic block that is adapted to provide a first signal operating between first and second levels and a second logic block that is adapted to receive a second signal operating between first and third levels. The IC further comprises a level translator that is coupled between the first and second logic blocks. The level translator includes an input stage that is coupled to receive the first signal and is adapted to provide the second signal and a booster stage that is coupled to the input stage. The booster stage is activated to increase a magnitude of the third level of the second signal in response to a control signal. The control signal is activated when a power supply signal magnitude providing the third level is below a threshold value.

In accordance with another embodiment of the invention, a level translator comprises a first differential transistor pair that is coupled to receive an input signal operating between first and second voltage levels and is adapted to provide first and second output signals operating between first and third voltage levels, the first and second output signals being respectively provided to first and second nodes. The level translator further comprises a booster stage that is coupled to the first and second nodes and is programmably adapted to increase the third voltage level of the first and second output signals in response to a control signal. The control signal indicates that a power supply signal magnitude has fallen below a threshold voltage level.

BRIEF DESCRIPTION OF THE DRAWINGS

Various aspects and advantages of the invention will become apparent upon review of the following detailed description and upon reference to the drawings, in which.

DETAILED DESCRIPTION

A programmable booster stage is provided to augment the drive level of a level translator under certain conditions. In particular, a booster stage is applied at the pull-up circuitry of a cross-coupled latch, whereby the booster stage is programmably activated when the voltage levels at the high voltage portion of the level translator are reduced with respect to the voltage levels at the low voltage portion of the level translator.

For example, the programmable level translator may be implemented between an input/output (I/O) portion, i.e., the high voltage portion, of an integrated circuit (IC) such as a Field Programmable Gate Array (FPGA), and a portion of the FPGA operating at lower voltages, i.e., the low voltage portion, such as the logic core of the FPGA. In such an instance, the programmable level translator may translate the voltage magnitude of signals operating at the low voltage portion to a voltage magnitude that is compatible with the voltage level of signals operating at the high voltage portion.

In a first phase of operation, the programmable level translator may operate in a non-boosted configuration, whereby the logic level of a memory cell within the FPGA deactivates a booster stage of the level translator. In a second phase of operation, the programmable level translator may operate in a boosted configuration, whereby the logic level of a memory cell within the FPGA activates the booster stage of the level translator.

Figure 1:
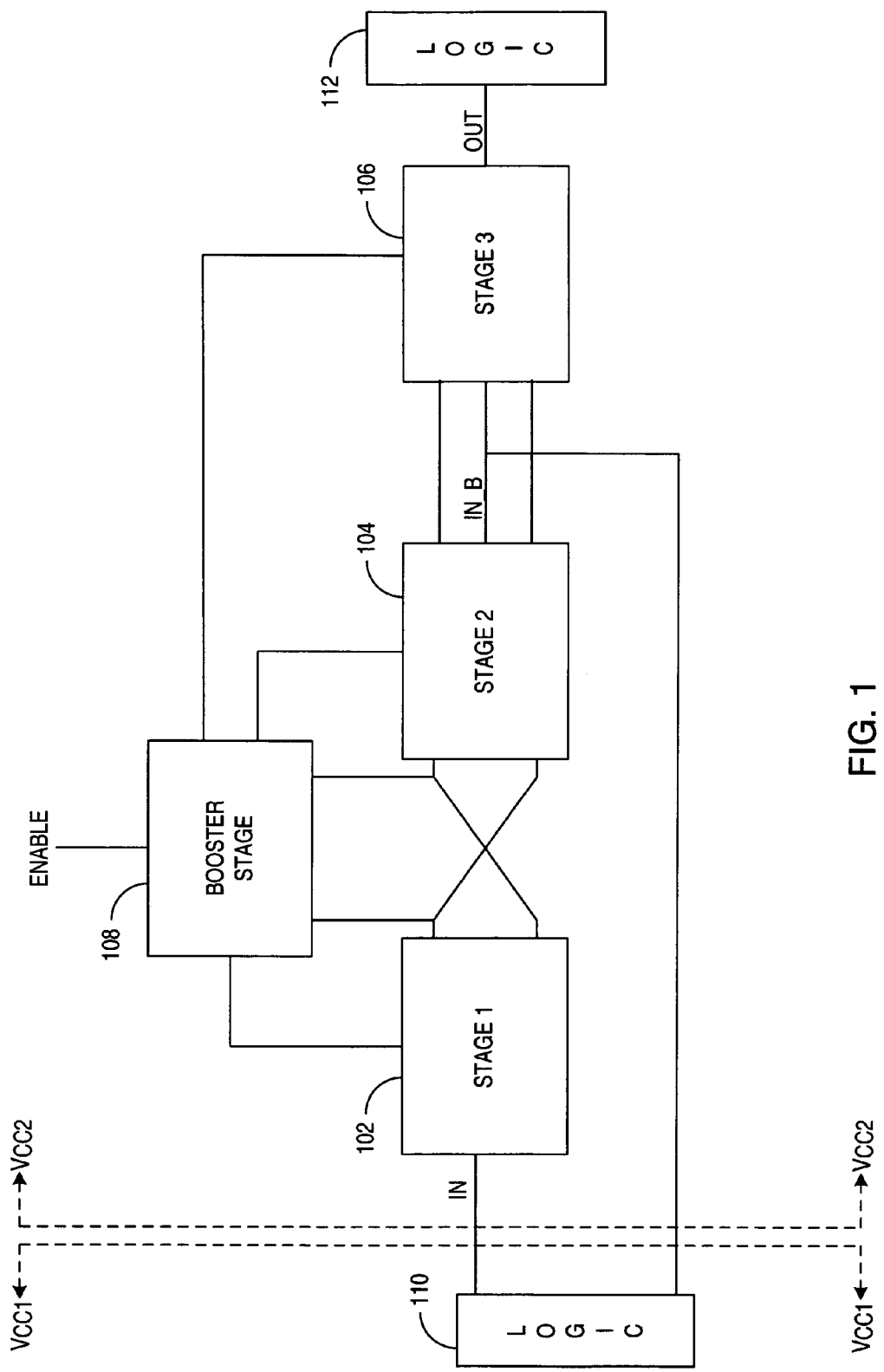
FIG. 1 illustrates an exemplary block diagram of a programmable level translator.

Turning to FIG. 1, an exemplary block diagram of a programmable level translator is illustrated. Logic block 110 to the left of the $V_{CC1}$ dotted line exemplifies a region of logic devices, within the IC or FPGA, that are operating at a reduced voltage magnitude that is substantially equal to $V_{CC1}$. The reduced voltage magnitude of $V_{CC1}$, for example, may represent the voltage magnitude of the logic core portion of the IC or FPGA. Conversely, the logic block 112 to the right of the $V_{CC2}$ dotted line exemplifies a region of logic devices within the IC or FPGA that are operating at an increased voltage magnitude, relative to $V_{CC1}$, that is substantially equal to $V_{CC2}$. The increased voltage magnitude of $V_{CC2}$, for example, may represent the voltage magnitude of the I/O interface portion of the IC or FPGA. The level translator of blocks 102-108 provide voltage level translation between logic blocks 110 and 112. $V_{CC2}$ may, for example, represent a variable voltage whose magnitude is dependent upon the particular I/O interface being implemented by the IC or FPGA. In one embodiment, the voltage level of $V_{CC2}$ may range between 1.2 volts and 3.3 volts depending upon the particular I/O interface standard being implemented.

Signals IN and IN_B represent a differential signal that is propagated from the logic block 110, which is operating at voltages between $V_{CC1}$ and a reference potential, e.g., ground potential. The signal is then propagated through stages 102-106 to ultimately provide the output signal, OUT, to logic block 112, which is operating between $V_{CC2}$ and the reference potential. In an alternate embodiment, signal IN may be provided as a single-ended signal by logic block 110, from which signal IN_B may be derived using an inverter.

In a first phase of operation, signal ENABLE is programmed to a logic low voltage, and booster stage 108 is deactivated. In such an instance, booster stage 108 does not activate additional pull-up circuitry to augment the pull-up circuitry of stages 102-106. In a second phase of operation, signal ENABLE is programmed to a logic high voltage, and booster stage 108 is activated. In this instance, booster stage 108 activates additional pull-up circuitry to augment the operation of the pull-up circuitry of stages 102-106.

In a first embodiment, signal ENABLE may be provided via a memory cell of the FPGA, whereby during a reconfiguration of the FPGA, the logic value of the memory cell may be programmed to its desired level. In particular, signal ENABLE may be programmed to a logic high value, via the memory cell, when $V_{CC2}$ is at a magnitude of, e.g., 1.8 volts or below. Conversely, signal ENABLE may be programmed to a logic low value, via the memory cell, when $V_{CC2}$ is at a magnitude that is greater than, e.g., 1.8 volts. In alternate embodiments, signal ENABLE may instead be programmed by a control signal generated from logic devices within the IC or FPGA.

Figure 2:
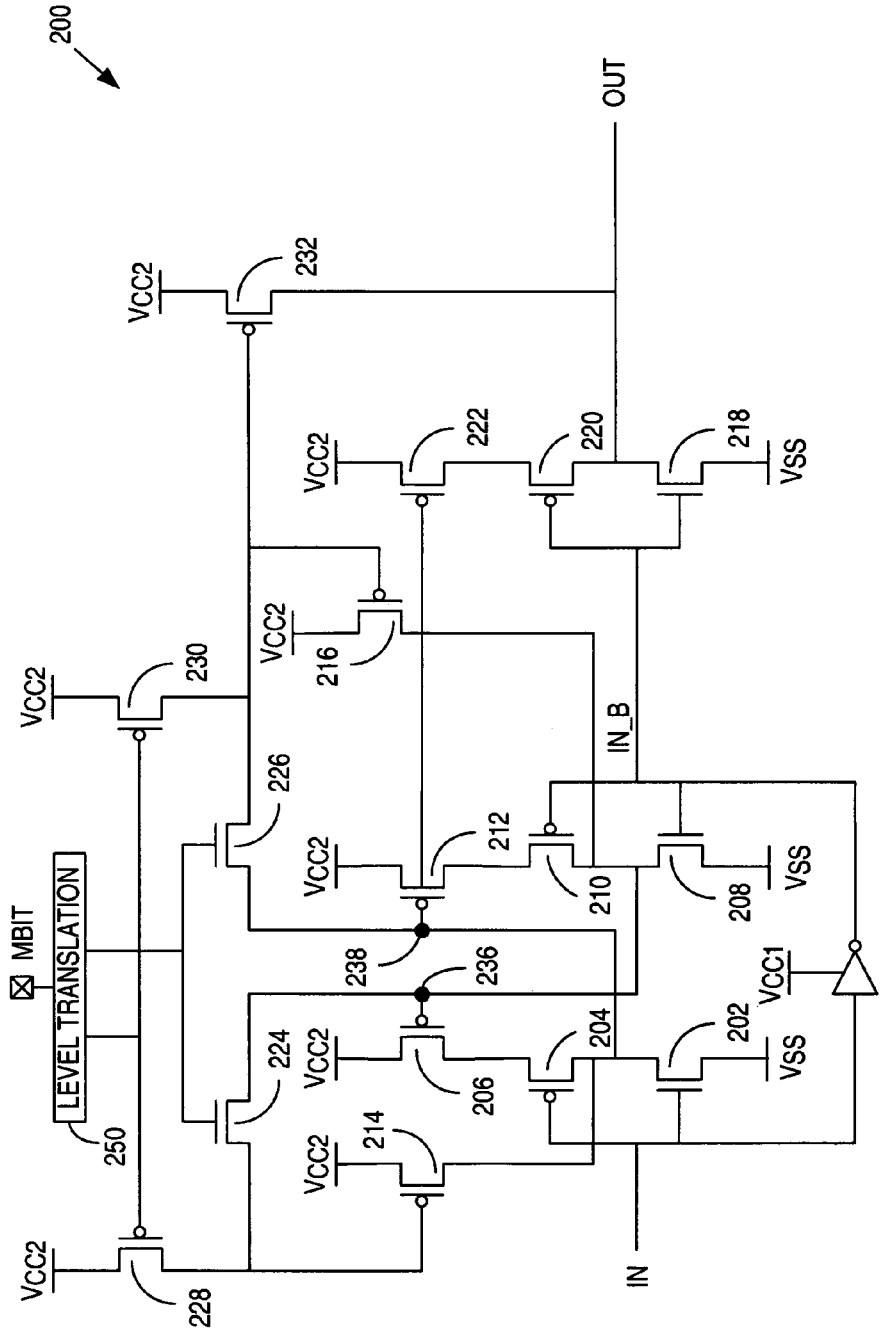
FIG. 2 illustrates an exemplary schematic of a programmable level translator.

Turning to FIG. 2, an exemplary schematic diagram of the level translator of FIG. 1 is illustrated. Stage 102 of FIG. 1, for example, is implemented via transistors 202-206, whereby P-type transistors 204 and 206 provide a stacked active load for N-type transistor 202. Stage 104 of FIG. 1, for example, is implemented via transistors 208-212, whereby P-type transistors 210 and 212 provide a stacked active load for N-type transistor 208. Stages 102 and 104 are deemed to form an input stage to receive an input signal, e.g., IN and IN_B, that is operating at the logic core voltage. Stage 106 of FIG. 1, for example, is implemented via transistors 218-222, whereby P-type transistors 220 and 222 provide a stacked active load for N-type transistor 218.

Booster stage 108 is implemented, for example, via transistors 214, 216, and 232, whereby P-type transistor 214 provides programmable boost for transistors 204-206, P-type transistor 216 provides programmable boost for transistors 210-212, and P-type transistor 232 provides programmable boost for transistors 220-222. In addition to boost transistors 214, 216, and 232, booster stage 108 also includes transistor pair 224/228, which operates to enable boost transistor 214 when the logic value of memory cell, MBIT, is programmed to a logic high value. Similarly, transistor pair 226/230 operates to enable boost transistors 216 and 232 when the logic value of memory cell, MBIT, is programmed to a logic high value.

During a first phase of operation, the logic value of memory cell MBIT is programmed to a logic low value (e.g., during a reconfiguration of the FPGA) to deactivate booster stage 108. In such an instance, N-type transistor 224 is placed into a non-conductive state and P-type transistor 228 is placed into a conductive state. Therefore, the gate terminal of boost transistor 214 is biased to be substantially equal to $V_{CC2}$, placing transistor 214 into a non-conductive state. Similarly, N-type transistor 226 is placed into a non-conductive state and P-type transistor 230 is placed into a conductive state. Therefore, the gate terminals of boost transistors 216 and 232 are biased to be substantially equal to $V_{CC2}$, placing transistors 216 and 232 into non-conductive states. Thus, during the first phase of operation, level translator 200 operates in a non-boosted configuration, whereby boost transistors 214, 216, and 232 are deactivated, in response to $V_{CC2}$ being above a threshold value, e.g., 1.8 volts.

Signal IN is received at the gate terminals of transistors 202 and 204 and signal IN_B is received at the gate terminals of transistors 208, 210 and 218, 220. When signal IN transitions from a logic low value to a logic high value, N-type transistor 202 is placed into a conductive state, placing node 238 at a potential substantially equal to $V_{SS}$, e.g., ground potential. As such, P-type transistors 212 and 222 are placed into conductive states.

Similarly, signal IN_B transitions from a logic high value to a logic low value, placing N-type transistors 208 and 218 into non-conductive states and placing P-type transistors 210, 220 into conductive states. Therefore, node 236 is biased to a potential that is substantially equal to $V_{CC2}$, through transistors 210 and 212, each of which is in a conductive state. Similarly, node OUT is also biased to a potential that is substantially equal to $V_{CC2}$, through transistors 220 and 222, each of which is in a conductive state. Node 238 is pulled to a logic low value via transistor 202, and, through cross-coupled feedback, node 236 is pulled to a logic high value via pull-up transistors 210 and 212.

On the other hand, when signal IN transitions from a logic high value to a logic low value, N-type transistor 202 is placed into a non-conductive state and P-type transistor 204 is placed into a conductive state. Similarly, signal IN_B transitions from a logic low value to a logic high value, placing N-type transistors 208 and 218 into conductive states. Therefore, node 236 and node OUT are placed at a potential substantially equal to $V_{SS}$, e.g., ground potential. Therefore, P-type transistor 206 is placed into a conductive state, biasing node 238 to a potential that is substantially equal to $V_{CC2}$, through transistors 204 and 206, each of which is in a conductive state. Thus, node 236 is pulled to a logic low value via transistor 208, and, through cross-coupled feedback, node 238 is pulled to a logic high value via pull-up transistors 204 and 206.

During a second phase of operation, the logic value of memory cell MBIT is programmed to a logic high value (e.g., during a reconfiguration of the FPGA) to activate booster stage 108. In such an instance, N-type transistor 224 is placed into a conductive state and P-type transistor 228 is placed into a non-conductive state. Therefore, the gate terminal of boost transistor 214 is biased to a potential that is substantially equal to the potential at node 236. Similarly, N-type transistor 226 is placed into a conductive state and P-type transistor 230 is placed into a non-conductive state. Therefore, the gate terminals of boost transistors 216 and 232 are biased to a potential that is substantially equal to the potential at node 238. Thus, during the second phase of operation, level translator 200 operates in a boosted configuration, in response to $V_{CC}$ being below a threshold value, e.g., 1.8 volts.

Signal IN is received at the gate terminals of transistors 202 and 204 and signal IN_B is received at the gate terminals of transistors 208, 210 and 218, 220. When signal IN transitions from a logic low value to a logic high value, N-type transistor 202 is placed into a conductive state, placing node 238 at a potential substantially equal to $V_{SS}$, e.g., ground potential. Therefore, P-type transistor 212 is placed into a conductive state. In addition, through operation of the boosted configuration as programmed by memory cell MBIT, P-type transistors 216 and 232 are also placed into a conductive state.

Similarly, signal IN_B transitions from a logic high value to a logic low value, placing N-type transistors 208 and 218 into non-conductive states and placing P-type transistors 210 and 220 into conductive states. Therefore, node 236 is biased to a potential that is substantially equal to $V_{CC2}$, through transistors 210, 212 and through boost transistor 216, each of which is in a conductive state.

Thus, node 238 is pulled to a logic low value via transistor 202, and, through cross-coupled feedback during the boosted configuration, node 236 is pulled to a logic high value via pull-up transistors 210, 212 and boost transistor 216. In other words, boost transistor 216 augments operation of pull-up transistors 210 and 212 by establishing an additional current path from node 236 to power supply $V_{CC2}$, thereby increasing the magnitude of the logic high value at node 236 to be closer in magnitude to the voltage level supplied by power supply $V_{CC2}$. In addition, output node OUT is also pulled to a logic high value via transistors 220, 222 and is augmented by boost transistor 232.

On the other hand, when signal IN transitions from a logic high value to a logic low value, N-type transistor 202 is placed into a non-conductive state and P-type transistor 204 is placed into a conductive state. Similarly, signal IN_B transitions from a logic low value to a logic high value, placing N-type transistors 208 and 218 into conductive states, placing node 236 and node OUT at a potential substantially equal to $V_{SS}$, e.g., ground potential. Therefore, P-type transistor 206 and boost transistor 214 are placed into a conductive state, biasing node 238 to a potential that is substantially equal to $V_{CC2}$, through transistors 204, 206 and boost transistor 214, each of which is in a conductive state.

Thus, node 236 is pulled to a logic low value via transistor 208, and, through cross-coupled feedback during the boosted configuration, node 238 is pulled to a logic high value via pull-up transistors 204, 206 and boost transistor 214. In other words, boost transistor 214 augments operation of pull-up transistors 204 and 206 by establishing an additional current path from node 238 to power supply $V_{CC2}$, thereby increasing the magnitude of the logic high value at node 238 to be closer in magnitude to the voltage level supplied by power supply $V_{CC2}$.

As will be apparent to those of skill in the art, current drive through transistors 224 and 226 is optimized when the gates of transistors 224 and 226 are biased at a voltage that is a threshold voltage higher than $V_{CC2}$. Thus, transistors 224 and 226 may be biased to a voltage that is a threshold voltage higher in magnitude than $V_{CC2}$, as supplied by level translation block 250, while the gates of transistors 228 and 230 may be biased at a voltage equal to $V_{CC2}$, as supplied by level translation block 250.

Figure 3:
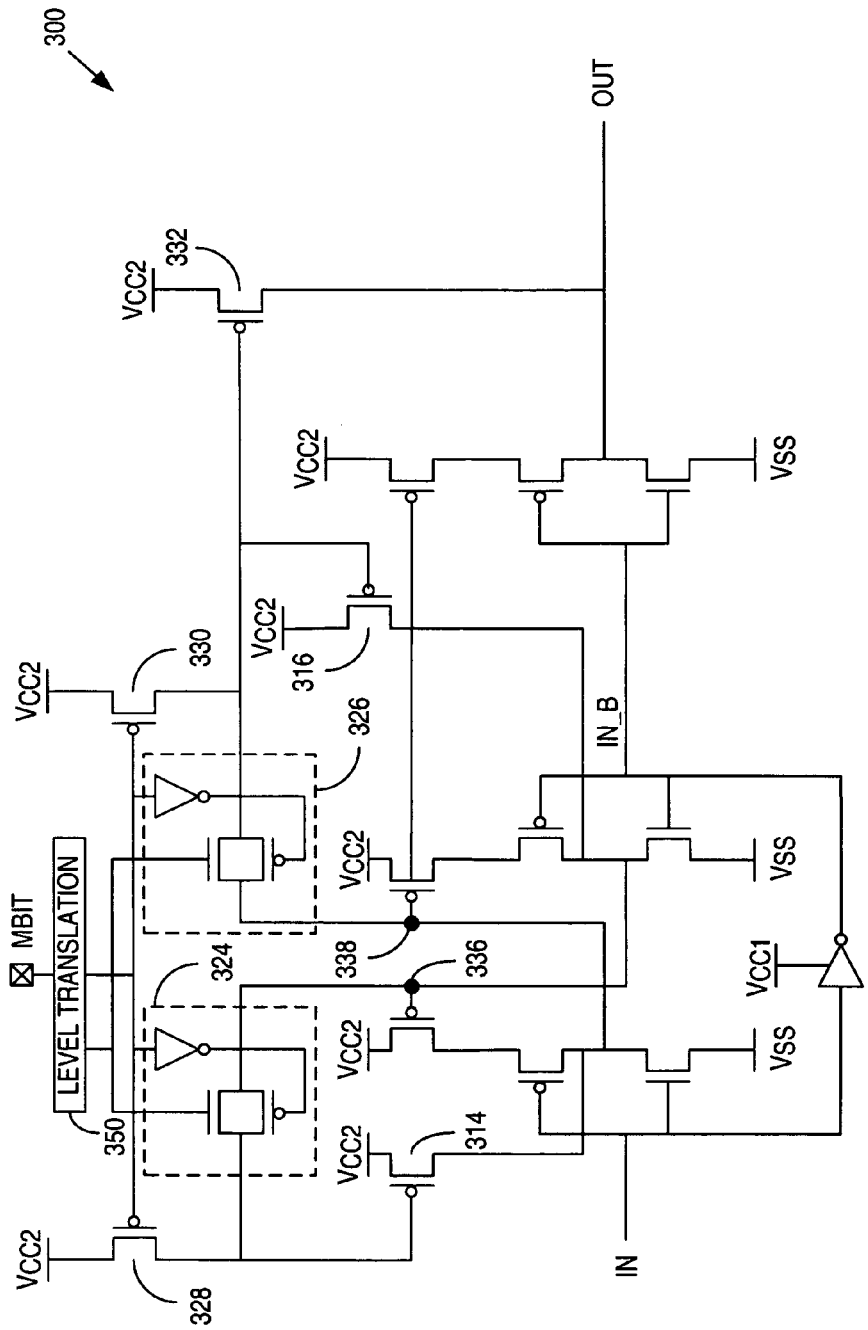
FIG. 3 illustrates a first alternative schematic diagram of an exemplary programmable level translator.

FIG. 3 illustrates a first alternative embodiment. In particular, N-type transistors 224 and 226 of FIG. 2 are replaced with transmission gates 324 and 326, respectively. Transmission gates 324 and 326 may be used in an alternative embodiment, to allow the gates of boost transistors 314, 316, and 332 to be biased via nodes 336 and 338, respectively, during the boosted configuration as programmed by memory cell MBIT. Transmission gates 324 and 326 may be placed into a non-conductive state, and the boost transistors 314, 316, and 332 can be deactivated by biasing their gates to $V_{CC2}$ through P-type transistors 328 and 330 during a non-boosted configuration as programmed by memory cell MBIT.

As discussed above, level translation block 350 may be used to improve the performance of the N-type transistors of transmission gates 324 and 326, which improves the performance of the booster stage, thereby increasing the performance of the level translator during the boosted configuration.

Figure 4:
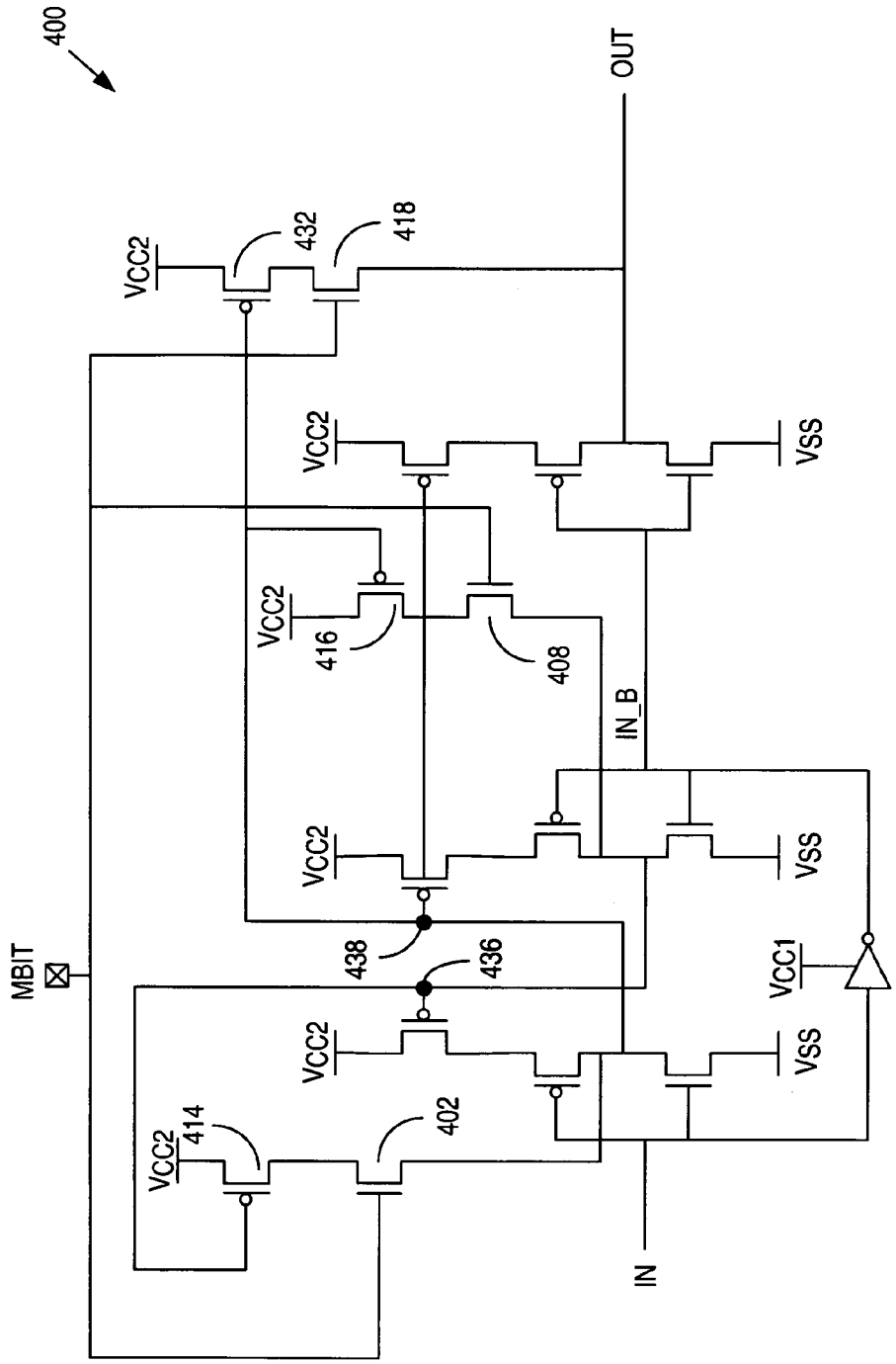
FIG. 4 illustrates a second alternative schematic diagram of an exemplary programmable level translator.

FIG. 4 illustrates a second alternative embodiment. In particular, boost configuration enable transistors 224-230 of FIG. 2 are eliminated and replaced with boost configuration enable N-type transistors 402, 408, and 418. In the embodiment of FIG. 4, the gate terminals of boost transistors 414, 416, and 432 are directly biased via nodes 436 and 438, respectively. Control of the boost configuration is established via N-type transistors 402, 408, and 418, which are placed in series with boost transistors 414, 416, and 432.

In the boost configuration, the logic value of memory cell MBIT is programmed to a logic high value, placing N-type transistors 402, 408, and 418 into a conductive state, and allowing boost transistors 414, 416, and 432 to boost the pull-up circuitry of level translator 400 as discussed above. In a non-boost configuration, the logic value of memory cell MBIT is programmed to a logic low value, placing N-type transistors 402, 408, and 418 into a non-conductive state, and disconnecting boost transistors 414, 416, and 432 from the pull-up circuitry of level translator 400.

Because the booster stage is only used for $V_{CC2}$ voltage magnitudes below a threshold voltage, e.g., 1.8 v, the gates of N-type transistors 402, 408 and 418 may be biased to a fixed supply magnitude, e.g., 2.5 v. Thus, MBIT may be biased to 2.5 v, so that nodes 436, 438 and OUT may be fully biased to the $V_{CC2}$ voltage magnitude through P-type transistors 414, 416 and 432.

Figure 5:
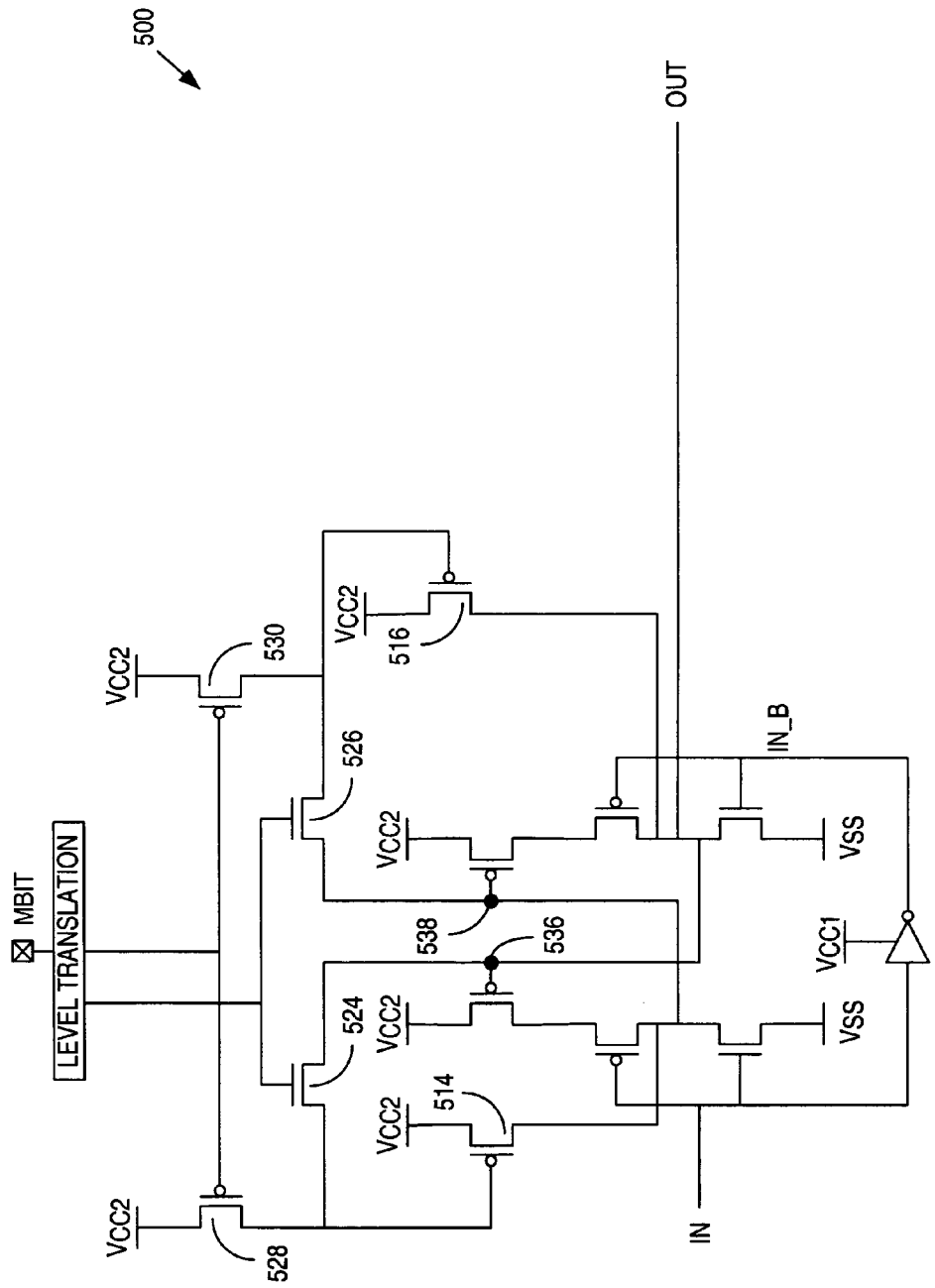
FIG. 5 illustrates a third alternative schematic diagram of an exemplary programmable level translator.

FIG. 5 illustrates a third alternative embodiment, in which stage 3 of FIG. 2, comprising transistors 218-222, and boost transistor 232 are eliminated. In such an instance, the cross-coupled feedback operation of nodes 536 and 538 operate to activate boost transistors 514 and 516 as discussed above in relation to FIG. 2 when level translator 500 is operating in a boost configuration as programmed by memory cell MBIT. The output of stage 2 at node 536 is used to drive the output of level translator 500 at node OUT.

Figure 6:
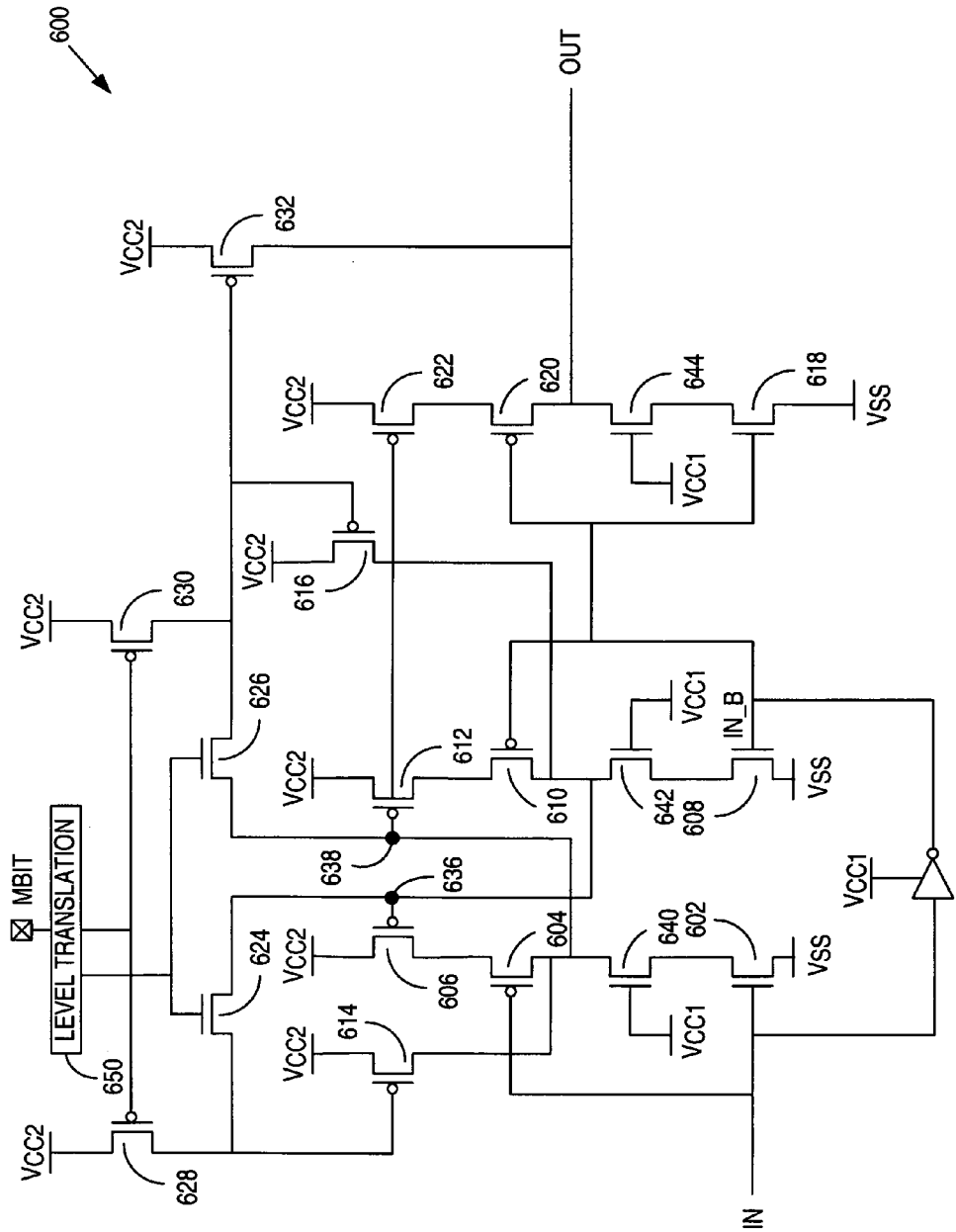
FIG. 6 illustrates a fourth alternative schematic diagram of an exemplary programmable level translator.

FIG. 6 illustrates a fourth alternative embodiment, which is nearly identical to the level translator of FIG. 2, except that a cascode configuration is utilized. In particular, N-type transistor 640 is added between N-type transistor 602 and P-type transistor 604; N-type transistor 642 is added between N-type transistor 608 and P-type transistor 610; and N-type transistor 644 is added between N-type transistor 618 and P-type transistor 620.

It is noted that transistors 602, 608, and 618 are logic core devices, whose gates are biased by logic core signals, whereas transistors 640, 642, and 644 are I/O devices whose gates are biased by $V_{CC1}$. Thus, as discussed in more detail below, the drive level of transistors 602, 640, 608, 642 and 618, 644 is maximized and the risk of latch-up or electrostatic discharge (ESD) is minimized.

During a first phase of operation, the logic value of memory cell MBIT is programmed to a logic low value (during, for example, a reconfiguration of the FPGA). In such an instance, N-type transistor 624 is placed into a non-conductive state and P-type transistor 628 is placed into a conductive state. Therefore, the gate terminal of boost transistor 614 is biased to be substantially equal to $V_{CC2}$, placing transistor 614 into a non-conductive state. Similarly, N-type transistor 626 is placed into a non-conductive state and P-type transistor 630 is placed into a conductive state. Therefore, the gate terminals of boost transistors 616 and 632 are biased to be substantially equal to $V_{CC2}$, placing transistors 616 and 632 into a non-conductive state. Thus, during the first phase of operation, level translator 600 operates in a non-boosted configuration, wherein boost transistors 614, 616, and 632 are deactivated.

Signal IN is received at the gate terminals of transistors 602 and 604 and signal IN_B is received at the gate terminals of transistors 608, 610 and 618, 620. When signal IN transitions from a logic low value to a logic high value, N-type transistor 602 is placed into a conductive state. Transistor 640 is already in a conductive state through a bias signal, $V_{CC1}$, that is applied to the gate terminal of transistor 640.

The cascode configuration of transistors 602 and 640 provides a larger voltage gain than the single transistor configuration of FIG. 2. In other words, since transistor 602 is a logic core voltage device, it has a lower threshold voltage as compared to transistor 640. Thus, transistor 602, given the same input signal, may achieve a conductive state sooner, which increases the drive level at node 638. Node 638 may then be driven to a potential that is substantially equal to $V_{SS}$, e.g., ground potential, which places P-type transistors 612 and 622 into conductive states.

Similarly, signal IN_B transitions from a logic high value to a logic low value, placing N-type transistors 608 and 618 into non-conductive states and placing P-type transistors 610, 620 into conductive states. Therefore, node 636 is biased to a potential that is substantially equal to $V_{CC2}$, through transistors 610 and 612, each of which is in a conductive state. Similarly, node OUT is also biased to a potential that is substantially equal to $V_{CC2}$, through transistors 620 and 622. Thus, node 638 is driven harder to a logic low value via cascode transistors 602 and 640, and, through cross-coupled feedback and cascode configuration, node 636 is pulled to a logic high value via pull-up transistors 610 and 612.

On the other hand, when signal IN transitions from a logic high value to a logic low value, N-type transistor 602 is placed into a non-conductive state and P-type transistor 604 is placed into a conductive state. Similarly, signal IN_B transitions from a logic low value to a logic high value, placing transistor 608 and transistor 618 into conductive states. The cascode configuration of transistors 608 and 642 drives node 636 to a potential substantially equal to $V_{SS}$, e.g., ground potential and the cascode configuration of transistors 618 and 644 drives node OUT to a potential substantially equal to $V_{SS}$, e.g., ground potential. As such, P-type transistor 606 is placed into a conductive state, which biases node 638 to a potential that is substantially equal to $V_{CC2}$, through transistors 604 and 606, each of which are in conductive states. Thus, node 636 is driven to a logic low value via cascode transistors 608 and 642, and through cross-coupled feedback and cascode configuration, node 638 is pulled to a logic high value via pull-up transistors 604 and 606.

During a second phase of operation, the logic value of memory cell, MBIT, is programmed to a logic high value (during, for example, a reconfiguration of the FPGA) to activate booster stage 108. In such an instance, N-type transistor 624 is placed into a conductive state and P-type transistor 628 is placed into a non-conductive state. Therefore, the gate terminal of boost transistor 614 is biased to a potential that is substantially equal to the potential at node 636. Similarly, N-type transistor 626 is placed into a conductive state and P-type transistor 630 is placed into a non-conductive state. Therefore, the gate terminals of boost transistors 616 and 632 are biased to a potential that is substantially equal to the potential at node 638. Thus, during the second phase of operation, level translator 600 operates in a boosted configuration.

Signal IN is received at the gate terminals of transistors 602 and 604 and signal IN_B is received at the gate terminals of transistors 608, 610 and 618, 620. When signal IN transitions from a logic low value to a logic high value, N-type transistor 602 is placed into a conductive state. Transistor 640 is already in a conductive state through a bias signal, $V_{CC1}$, that is applied to the gate terminal of transistor 640. As discussed above, the cascode configuration of transistors 602 and 640 provides a larger voltage gain than the single transistor configuration of FIG. 2, which increases the drive level at node 638. Thus, node 638 is driven to a potential substantially equal to $V_{SS}$, e.g., ground potential, placing P-type transistors 612 and 622 into conductive states. In addition, through operation of the boosted configuration as programmed by memory cell MBIT, P-type transistors 616 and 632 are also placed into a conductive state.

Similarly, signal IN_B transitions from a logic high value to a logic low value, placing N-type transistors 608 and 618 into non-conductive states and placing P-type transistors 610 and 620 into conductive states. Therefore, node 636 is biased to a potential that is substantially equal to $V_{CC2}$ through transistors 610, 612 and through boost transistor 616, each of which is in a conductive state.

Thus, node 638 is driven to a logic low value via cascode transistors 602 and 640, and, through cross-coupled feedback and cascode configuration during the boosted configuration, node 636 is pulled to a logic high value via pull-up transistors 610, 612 and boost transistor 616. In other words, boost transistor 616 augments the operation of pull-up transistors 610 and 612 by establishing an additional current path from node 636 to power supply $V_{CC2}$, thereby increasing the magnitude of the logic high value at node 636 to be closer in magnitude to the voltage level supplied by power supply $V_{CC2}$. In addition, output node OUT is also pulled to a logic high value via transistors 620, 622 and is augmented by boost transistor 632.

On the other hand, when signal IN transitions from a logic high value to a logic low value, N-type transistor 602 is placed into a non-conductive state and P-type transistor 604 is placed into a conductive state. Similarly, signal IN_B transitions from a logic low value to a logic high value, placing N-type transistors 608 and 618 into conductive states. Transistor 642 is already in a conductive state through a bias signal, $V_{CC1}$, that is applied to the gate terminal of transistor 642. As discussed above, the cascode configuration of transistors 608 and 642 provides a larger voltage gain than the single transistor configuration of FIG. 2, which increases the drive level at node 636.

Thus, node 636 is driven to a potential substantially equal to $V_{SS}$, e.g., ground potential, and node OUT is pulled to a potential substantially equal to $V_{SS}$, e.g., ground potential. As such, P-type transistor 606 and boost transistor 614 are placed into a conductive state, which biases node 638 to a potential that is substantially equal to $V_{CC2}$ through transistors 604, 606 and boost transistor 614, each of which is in a conductive state.

Thus, node 636 is driven to a logic low value via cascode transistors 608 and 642, and, through cross-coupled feedback and cascode configuration during the boosted configuration, node 638 is pulled to a logic high value via pull-up transistors 604, 606 and boost transistor 614. In other words, boost transistor 614 augments the operation of pull-up transistors 604 and 606 by establishing an additional current path from node 638 to power supply $V_{CC2}$, thereby increasing the magnitude of the logic high value at node 638 to be closer in magnitude to the voltage level supplied by power supply $V_{CC2}$.

As will be apparent to those of skill in the art, current drive through transistors 624 and 626 is optimized when the gates of transistors 624 and 626 are biased at a voltage that is a threshold voltage higher than $V_{CC2}$. Thus, transistors 624 and 626 may be biased to a voltage that is a threshold voltage higher in magnitude than $V_{CC2}$, as supplied by level translation block 650, while the gates of transistors 628 and 630 may be biased at a voltage equal to $V_{CC2}$, as supplied by level translation block 650.

Other aspects and embodiments of the present invention will be apparent to those skilled in the art from consideration of the specification and practice of the invention disclosed herein. For example, the boost transistor stages described herein are illustrated as P-type transistors. It is recognized that the boost transistor stages may also be implemented as N-type transistors through appropriate modification of the enabling circuitry. Similarly, bipolar transistors may also be used instead of, or in addition to, the Field Effect Transistors (FETs) as illustrated herein. Thus, it is intended that the specification and illustrated embodiments be considered as examples only, with a true scope and spirit of the invention being indicated by the following claims.

What is claimed is:

1. A level translator, comprising:
    a first stage coupled to receive a first phase of an input signal operating between first and second voltage levels, the first stage being adapted to provide a first output signal operating between a third voltage level and the second voltage level, the first output signal being provided at a first node, the first stage comprising:
        a first transistor of a first conductivity type coupled to receive the first phase of the input signal at a control terminal of the first transistor;
        a second transistor of a second conductivity type coupled to receive the first phase of the input signal at a control terminal of the second transistor, the second transistor having a first conduction terminal coupled to a first conduction terminal of the first transistor; and
        a third transistor of the second conductivity type having a control terminal coupled to the second node and a first conduction terminal coupled to a second conduction terminal of the second transistor;
    a second stage coupled to receive a second phase of the input signal operating between first and second voltage levels, the second stage being adapted to provide a second output signal operating between the third voltage level and the second voltage level, the second output signal being provided at a second node; and
    a booster stage coupled to the first and second nodes, the booster stage being activated by a control signal to increase a magnitude of the third voltage level of the first and second output signals, wherein the control signal activates the booster stage when a power supply signal magnitude providing the third voltage level is below a threshold value.

2. The level translator of claim 1, wherein the second stage comprises:
    a fourth transistor of the first conductivity type coupled to receive the second phase of the input signal at a control terminal of the fourth transistor;
    a fifth transistor of the second conductivity type coupled to receive the second phase of the input signal at a control terminal of the fifth transistor, the fifth transistor having a first conduction terminal coupled to a first conduction terminal of the fourth transistor; and
    a sixth transistor of the second conductivity type having a control terminal coupled to the first node and a first conduction terminal coupled to a second conduction terminal of the fifth transistor.

3. The level translator of claim 1, wherein the booster stage comprises:
    a seventh transistor of the second conductivity type having a first conduction terminal coupled to the first node and a second conduction terminal coupled to a first power supply; and
    a first enable circuit coupled to a control terminal of the seventh transistor, the first enable circuit being adapted to place the seventh transistor into a conductive state in response to a first phase of the control signal, and further being adapted to place the seventh transistor into a non-conductive state in response to a second phase of the control signal.

4. The level translator of claim 3, wherein the first enable circuit comprises:
an eighth transistor of the first conductivity type having a control terminal coupled to receive the control signal, a first conduction terminal coupled to the control terminal of the seventh transistor, and a second conduction terminal coupled to the second node; and
a ninth transistor of the second conductivity type having a control terminal coupled to receive the control signal, a first conduction terminal coupled to the first power supply, and a second conduction terminal coupled to a control terminal of the seventh transistor.

5. The level translator of claim 3, wherein the first enable circuit comprises a transmission gate having a control terminal coupled to receive the control signal, a first conduction terminal coupled to the control terminal of the seventh transistor, and a second conduction terminal coupled to the second node.

6. The level translator of claim 3, wherein the booster stage further comprises:
a tenth transistor of the second conductivity type having a first conduction terminal coupled to the second node and a second conduction terminal coupled to the first power supply; and
a second enable circuit coupled to a control terminal of the tenth transistor, the second enable circuit being adapted to place the tenth transistor into a conductive state in response to a first phase of the control signal, and further being adapted to place the tenth transistor into a non-conductive state in response to a second phase of the control signal.

7. The level translator of claim 6, wherein the second enable circuit comprises:
an eleventh transistor of the first conductivity type having a control terminal coupled to receive the control signal, a first conduction terminal coupled to the control terminal of the tenth transistor, and a second conduction terminal coupled to the first node; and
a twelfth transistor of the second conductivity type having a control terminal coupled to receive the control signal, a first conduction terminal coupled to the first power supply, and a second conduction terminal coupled to a control terminal of the tenth transistor.

8. The level translator of claim 6, wherein the second enable circuit comprises a transmission gate having a control terminal coupled to receive the control signal, a first conduction terminal coupled to the control terminal of the tenth transistor, and a second conduction terminal coupled to the first node.

9. The level translator of claim 6, further comprising a third stage coupled to receive the second phase of the input signal operating between first and second voltage levels and further coupled to receive the first output signal at the first node.

10. The level translator of claim 9, wherein the third stage comprises:
a thirteenth transistor of the first conductivity type coupled to receive the second phase of the input signal at a control terminal of the thirteenth transistor;
a fourteenth transistor of the second conductivity type coupled to receive the second phase of the input signal at a control terminal of the fourteenth transistor, the fourteenth transistor having a first conduction terminal coupled to a first conduction terminal of the thirteenth transistor; and
a fifteenth transistor of the second conductivity type having a control terminal coupled to the first node and a first conduction terminal coupled to a second conduction terminal of the fourteenth transistor.

11. The level translator of claim 10, wherein the booster stage further comprises a sixteenth transistor of the second conductivity type having a control terminal coupled to the control terminal of the tenth transistor, a first conduction terminal coupled to the first power supply, and a second conduction terminal coupled to the first conduction terminals of the thirteenth and fourteenth transistors.

12. An integrated circuit (IC), comprising:
a first logic block adapted to provide a first signal operating between first and second levels;
a second logic block adapted to receive a second signal operating between first and third levels; and
a level translator coupled between the first and second logic blocks, the level translator comprising,
an input stage coupled to receive the first signal and adapted to provide the second signal, the input stage comprising:
a first transistor of a first conductivity type having a control terminal coupled to receive a first phase of the first signal;
a second transistor of the first conductivity type having a control terminal coupled to receive a second phase of the first signal;
a first transistor stack of a second conductivity type coupled to a first conduction terminal of the first transistor, the first transistor stack being adapted to provide a second phase of the second signal to a first node in response to the first phase of the first signal; and
a second transistor stack of the second conductivity type coupled to a first conduction terminal of the second transistor, the second transistor stack being adapted to provide a first phase of the second signal to a second node in response to the second phase of the first signal; and
a booster stage coupled to the input stage, the booster stage being activated to increase a magnitude of the third level of the second signal in response to a control signal, wherein the booster stage comprises:
a third transistor of the second conductivity type having a first conduction terminal coupled to the first node and a control terminal coupled to receive the control signal; and
a fourth transistor of the second conductivity type having a first conduction terminal coupled to the second node and a control terminal coupled to receive the control signal, wherein the control signal originates from a memory cell of the IC, and wherein the control signal is activated when a power supply signal magnitude providing the third level is below a threshold value.

13. A level translator, comprising:
a first differential transistor pair coupled to receive an input signal operating between first and second voltage levels and adapted to provide first and second output signals operating between first and third voltage levels, the first and second output signals being respectively provided to first and second nodes; and
a booster stage coupled to the first and second nodes, the booster stage being programmably adapted to increase the third voltage level of the first and second output signals in response to a control signal, wherein the control signal indicates that a power supply signal magnitude has fallen below a threshold voltage level.

14. The level translator of claim 13, further comprising a second differential transistor pair coupled between the first differential transistor pair and the first and second nodes, the second differential transistor pair being coupled to receive a power supply signal at control terminals of the second differential transistor pair.

15. The level translator of claim 13, wherein the booster stage comprises:
 a first transistor having a first conduction terminal coupled to the first node and a control terminal coupled to receive the control signal; and
 a second transistor having a first conduction terminal coupled to a second conduction terminal of the first transistor and having a control terminal coupled to the second node.

16. The level translator of claim 15, wherein the booster stage further comprises:
 a third transistor having a first conduction terminal coupled to the second node and a control terminal coupled to receive the control signal; and
 a fourth transistor having a first conduction terminal coupled to a second conduction terminal of the third transistor and having a control terminal coupled to the first node.

17. The level translator of claim 16, wherein the booster stage further comprises:
 a fifth transistor having a control terminal coupled to receive the control signal and having a first conduction terminal coupled to an output of the level translator; and
 a sixth transistor having a first conduction terminal coupled to a second conduction terminal of the fifth transistor and a control terminal coupled to the first node.

* * * * *